US010867775B2

(12) United States Patent
Gu et al.

(10) Patent No.: US 10,867,775 B2
(45) Date of Patent: Dec. 15, 2020

(54) APPARATUS AND METHOD FOR TREATING SUBSTRATE

(71) Applicant: SEMES CO., LTD., Chungcheongnam-do (KR)

(72) Inventors: Jamyung Gu, Chungcheongnam-do (KR); Shin-Woo Nam, Yongin-si (KR); Jong Hwan An, Gyeonggi-do (KR); Saewon Na, Cheongju-si (KR); Jun Ho Lee, Chungcheongnam-do (KR); Jungmo Gu, Gyeonggi-do (KR)

(73) Assignee: SEMES CO., LTD., Chungcheongnam-Do (KR)

(*) Notice: Subject to any disclaimer, the term of this patent is extended or adjusted under 35 U.S.C. 154(b) by 194 days.

(21) Appl. No.: 15/660,158

(22) Filed: Jul. 26, 2017

(65) Prior Publication Data

US 2018/0033594 A1    Feb. 1, 2018

(30) Foreign Application Priority Data

Jul. 29, 2016    (KR) .................. 10-2016-0096933

(51) Int. Cl.
*H01J 37/32*    (2006.01)

(52) U.S. Cl.
CPC ...... *H01J 37/321* (2013.01); *H01J 37/32091* (2013.01); *H01J 37/32146* (2013.01); *H01J 37/32165* (2013.01); *H01J 37/32449* (2013.01)

(58) Field of Classification Search
CPC ........... H01J 37/32091; H01J 37/32146; H01J 37/32449; H01J 37/321; H01J 37/32165; H01L 21/68
See application file for complete search history.

(56) References Cited

U.S. PATENT DOCUMENTS

| 2006/0180968 A1* | 8/2006 | Kim ................. H01L 21/68785 269/51 |
| 2008/0020574 A1* | 1/2008 | Marakhtanov .... H01J 37/32091 438/689 |
| 2008/0119049 A1 | 5/2008 | Sung et al. |

(Continued)

FOREIGN PATENT DOCUMENTS

| CN | 102810447 A | 12/2012 |
| KR | 10-2006-0127044 A | 12/2006 |

(Continued)

*Primary Examiner* — Yuechuan Yu
(74) *Attorney, Agent, or Firm* — Li & Cai Intellectual Property (USA) Office

(57) ABSTRACT

The substrate treating apparatus includes a process chamber having a treatment space in the interior thereof, a support unit disposed in the process chamber to support a substrate, a gas supply unit configured to supply a process gas into the process chamber, and a plasma generating unit configured to generate plasma from the process gas. The plasma generating unit includes an upper electrode disposed on the substrate, a lower electrode disposed under the substrate to be vertically opposite to the upper electrode, and three high frequency power sources configured to apply high frequency power to the lower electrode. The three high frequency power sources include a first frequency power source and a second frequency power source having frequencies of 10 MHz or less, and a third frequency power source having a frequency of 10 MHz or more.

9 Claims, 4 Drawing Sheets

(56) References Cited

U.S. PATENT DOCUMENTS

| | | | | |
|---|---|---|---|---|
| 2009/0294061 | A1* | 12/2009 | Shannon | H01J 37/32091 156/345.24 |
| 2010/0213162 | A1* | 8/2010 | Mochiki | H01J 37/32027 216/17 |
| 2013/0199727 | A1 | 8/2013 | Iwata et al. | |

FOREIGN PATENT DOCUMENTS

| | | |
|---|---|---|
| KR | 1020060123064 | 12/2006 |
| KR | 1020080044657 A | 5/2008 |
| KR | 10-2010-0066956 A | 6/2010 |
| KR | 1020130082122 A | 7/2013 |
| KR | 1020140063781 A | 5/2014 |
| KR | 1020140110392 A | 9/2014 |
| KR | 10-2015-0082196 A | 7/2015 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0096933 filed Jul. 29, 2016, in the Korean Intellectual Property Office, the entire contents of which are hereby incorporated by reference.

BACKGROUND

Embodiments of the inventive concept described herein relate to a substrate treating apparatus and a substrate treating method, and more particularly to an apparatus and a method for treating a substrate by using plasma.

A semiconductor manufacturing process may include a process of treating a substrate by using plasma. For example, in an etching process of the semiconductor process, a thin film on the substrate may be removed by using plasma.

Plasma refers to an ionized gaseous state generated by a very high temperature, a strong electric field, or a radio frequency (RF) electromagnetic field and including ions, electrons, and radicals. In the semiconductor device manufacturing process, an etching process is performed by using plasma. The etching process is performed when ion particles contained in plasma collides with a substrate.

Accordingly, in a substrate treating process of etching a substrate by using plasma, a plasma generating apparatus by which a uniform etching rate may be obtained over the whole area of a substrate by controlling a density of plasma and ion energy more precisely is required.

SUMMARY

Embodiments of the inventive concept provide a substrate treating apparatus that may uniformly etch a substrate by controlling a density of plasma and ion energy more precisely, and a substrate treating method.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating apparatus including a process chamber having a treatment space in the interior thereof, a support unit disposed in the process chamber to support a substrate, a gas supply unit configured to supply a process gas into the process chamber, and a plasma generating unit configured to generate plasma from the process gas, wherein the plasma generating unit includes an upper electrode disposed on the substrate, a lower electrode disposed under the substrate to be vertically opposite to the upper electrode, and three high frequency power sources configured to apply high frequency power to the lower electrode, and wherein the three high frequency power sources include a first frequency power source and a second frequency power source having frequencies of 10 MHz or less, and a third frequency power source having a frequency of 10 MHz or more.

According to an embodiment, the first frequency power source and the second frequency power source may have frequencies ranging from 50 KHz to 10 MHz, and the third frequency power source may have a frequency ranging from 10 MHz to 100 MHz.

According to an embodiment, the frequency of the first frequency power source may be 400 KHz or 2 MHz, the frequency of the second frequency power source may be 9.8 MHz, and the frequency of the third frequency power source may be 60 MHz.

According to an embodiment, the high frequency power applied by the first frequency power source and the second frequency power source may increase ion energy input to the substrate, and the high frequency power applied by the third frequency power source may increase a density of plasma.

According to an embodiment, the upper electrode may be connected to a DC power source or a reference potential.

According to an embodiment, the upper electrode may be connected to a fourth frequency power source having a frequency ranging from 10 MHz to 100 MHz.

According to an embodiment, the substrate treating apparatus may further include a pulse supply configured to apply an on/off pulse to the three high frequency power sources.

According to an embodiment, the plasma generating unit may independently control pulse frequencies of the three high frequency power sources.

In accordance with another aspect of the inventive concept, there is provided a substrate treating method for treating a substrate by using the substrate treating apparatus as claimed in claim 1, the substrate treating method including applying high frequency power having at least three different frequencies to the lower electrode, wherein the three different frequencies are two frequencies of 10 MHz or less and one frequency of 10 MHz or more.

According to an embodiment, the applying of the high frequency power may include applying high frequency power having a first frequency of 10 MHz or less, applying high frequency power having a second frequency that is higher than the first frequency and not more than 10 MHz, and applying high frequency power having a third frequency of 10 MHz or more.

According to an embodiment, the first frequency may be 400 KHz or 2 MHz, the second frequency is 9.8 MHz, and the third frequency may be 60 MHz.

According to an embodiment, the substrate treating method may further include connecting a DC power source or a reference potential to the upper electrode.

According to an embodiment, the substrate treating method may further include applying high frequency power having a fourth frequency ranging from 10 MHz to 100 MHz to the upper electrode.

According to an embodiment, the applying of the high frequency power may include applying high frequency power pulsed to the lower electrode by applying an on/off pulse to the high frequency power.

According to an embodiment, the on/off pulse may be independently applied to at least one of the high frequency power having the three different frequencies.

In accordance with another aspect of the inventive concept, there is provided a plasma generating apparatus including an upper electrode and a lower electrode disposed to face each other while a space for generating plasma is interposed therebetween, and three high frequency power source configured to apply high frequency power having different frequencies to the lower electrode, wherein the three high frequency power sources include a first frequency power source and a second frequency power source having frequencies of 10 MHz or less, and a third frequency power source having a frequency of 10 MHz or more.

According to an embodiment, the first frequency power source and the second frequency power source may have frequencies ranging from 50 KHz to 10 MHz, and the third frequency power source may have a frequency ranging from 10 MHz to 100 MHz.

According to an embodiment, the frequency of the first frequency power source may be 400 KHz or 2 MHz, the frequency of the second frequency power source may be 9.8 MHz, and the frequency of the third frequency power source may be 60 MHz.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The above and other aspects, features and advantages of the invention will become apparent from the following description of the following embodiments given in conjunction with the accompanying drawings. However, the inventive concept is not limited to the embodiments disclosed below, but may be implemented in various forms. The embodiments of the inventive concept is provided to make the disclosure of the inventive concept complete and fully inform those skilled in the art to which the inventive concept pertains of the scope of the inventive concept.

Although not defined, all the terms (including technical or scientific terms) used herein may have the same meanings that are generally accepted by the common technologies in the field to which the inventive concept pertains. The terms defined by the general dictionaries may be construed to having the same meanings as those meant in the related technologies and/or the disclosure of the application, and will neither become conceptual nor be construed to be excessively formal even though not clearly defined herein. The terms used herein are provided to describe the embodiments but not to limit the inventive concept.

In the specification, the singular forms include plural forms unless particularly mentioned. The expressions 'include' and/or its various conjugated forms, such as 'including', which are used in the specification do not exclude existence or addition of one or more compositions, substances, elements, steps, operations, and/or devices. Further, the expressions such as 'comprising' and 'having' have to be construed in the same way.

Figure 1:
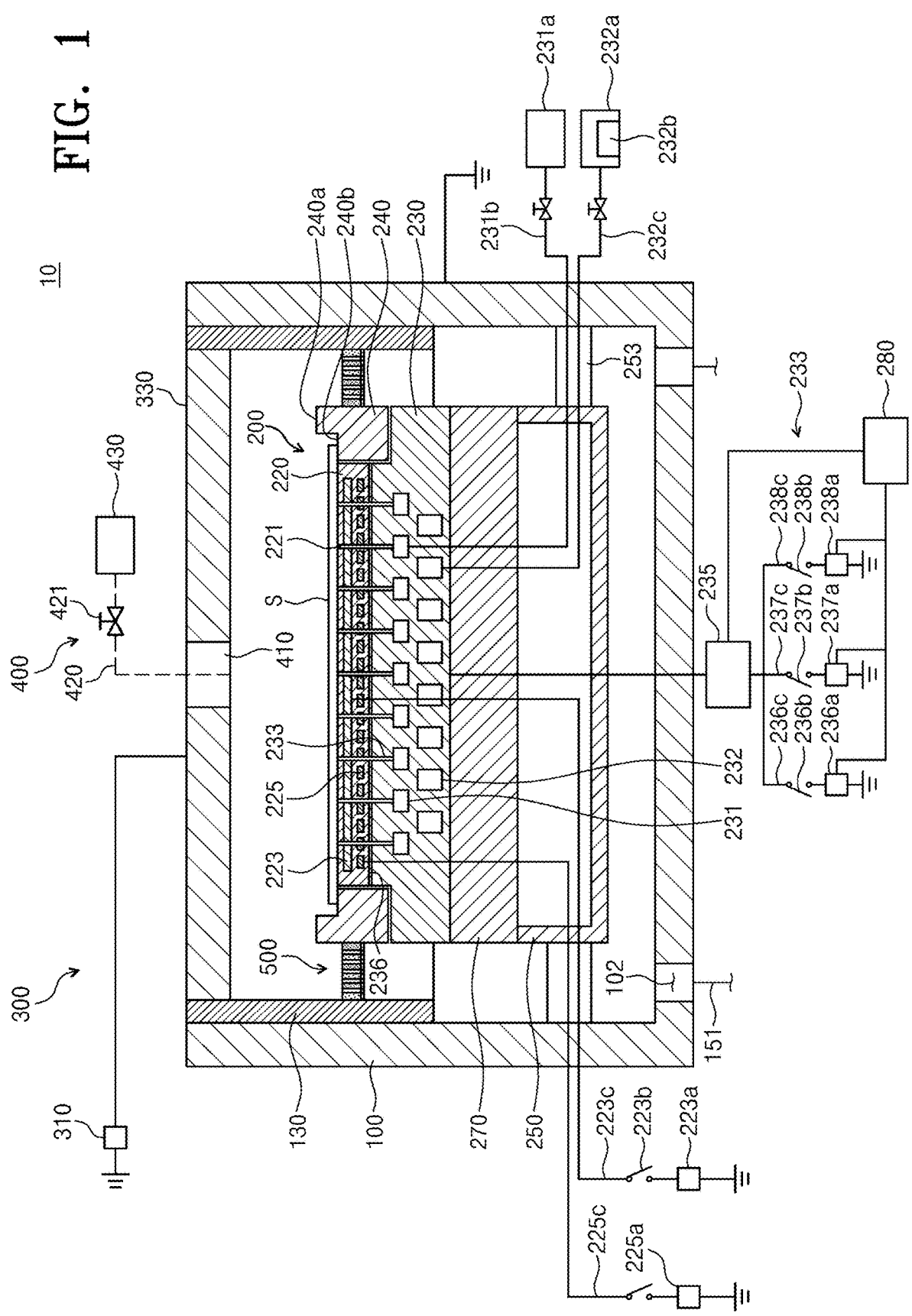
FIG. 1 is an exemplary view illustrating a substrate treating apparatus according to an embodiment of the inventive concept.

FIG. 1 is an exemplary view illustrating a substrate treating apparatus according to an embodiment of the inventive concept.

Although FIG. 1 illustrates a substrate treating apparatus by a capacitively coupled plasma (CCP) treatment method, the inventive concept is not limited thereto but may be also applied to a substrate treating apparatus by an inductively coupled plasma (ICP) treatment method.

Referring to FIG. 1, the substrate treating apparatus 10 treats a substrate S by using plasma. For example, the substrate treating apparatus 10 may perform an etching process on the substrate S. The substrate treating apparatus 10 may include a chamber 100, a substrate support assembly 200, a plasma generating unit 300, a gas supply unit 400, and a baffle unit 500.

The chamber 100 may provide a treatment space in which a substrate treating process is performed in the interior thereof. The chamber 100 may have a treatment space in the interior thereof, and may have a closed shape. The chamber 100 may be formed of a metallic material. The chamber 100 may be formed of aluminum. The chamber 100 may be grounded. An exhaust hole 102 may be formed on a bottom surface of the chamber 100. The exhaust hole 102 may be connected to an exhaust line 151. The reaction side-products generated in the process and gases left in the interior space of the chamber may be discharged to the outside through the exhaust line 151. The pressure of the interior of the chamber 100 may be reduced to a specific pressure through an exhaustion process.

According to an embodiment, a liner 130 may be provided in the interior of the chamber 100. Upper and lower surfaces of the liner 130 may have an opened cylindrical shape. The liner 130 may be provided to contact an inner surface of the chamber 100. The liner 130 may prevent an inner wall of the chamber 100 from being damaged due to arc discharging by protecting the inner wall of the chamber 100. Further, the liner 130 may prevent the impurities generated during the substrate treating process from being deposited to the inner wall of the chamber 100.

A substrate support assembly 200 may be located in the interior of the chamber 100. The substrate support assembly 200 may support the substrate S. The substrate support assembly 200 may include an electrostatic chuck 210 that suctions the substrate S by using an electrostatic force. Unlike this, the substrate support assembly 200 may support the substrate S in various methods such as mechanical clamping. Hereinafter, the substrate support assembly 200 including the electrostatic chuck 210 will be described.

The substrate support assembly 200 may include an electrostatic chuck 210, a lower cover 250, and a plate 270. The substrate support assembly 200 may be located in the interior of the chamber 100 to be spaced upwards apart from the bottom surface of the chamber 100.

The electrostatic chuck 210 may include a dielectric plate 220, a body 230, and a focus ring 240. The electrostatic chuck 210 may support the substrate S.

The dielectric plate 220 may be located at an upper end of the electrostatic chuck 210. The dielectric plate 220 may be formed of a dielectric substance of a disk shape. The substrate S may be positioned on an upper surface of the dielectric plate 220. The upper surface of the dielectric plate 220 may have a radius that is smaller than that of the substrate S. Accordingly, a peripheral area of the substrate S may be located on an outer side of the dielectric plate 220.

A first electrode 223, a heater 225, and a first supply passage 221 may be included in the interior of the dielectric plate 220. The first supply passage 221 may extend from an upper surface to a bottom surface of the dielectric plate 210. A plurality of first supply passages 221 are formed to be spaced apart from each other to be provided as passages through which a heat transfer medium is supplied to the bottom surface of the substrate S.

The first electrode 223 may be electrically connected to a first power source 223a. The first power source 223a may include a DC power source. A switch 223b may be installed between the first electrode 223 and the first power source 223a. The first electrode 223 may be electrically connected to the first power source 223a by switching on and off the switch 223b. If the switch 223b is switched on, a DC current may be applied to the first electrode 223. An electrostatic force may be applied between the first electrode 223 and the substrate S by a current applied to the first electrode 223, and the substrate S may be suctioned to the dielectric plate 220 by an electrostatic force.

The heater 225 may be located under the first electrode 223. The heater 225 may be electrically connected to a second power source 225a. The heater 225 may generate heat by a resistance due to a current applied to the second power source 225a. The generated heat may be transferred to the substrate S through the dielectric plate 220. The substrate S may be maintained at a specific temperature by the heat generated by the heater 225. The heater 225 may include a spiral coil.

The body 230 may be located under the dielectric plate 220. A bottom surface of the dielectric plate 220 and an upper surface of the body 230 may be bonded to each other by an adhesive 236. The body 230 may be formed of aluminum. An upper surface of the body 230 may be stepped such that a central area thereof is higher than a peripheral area thereof. The central area of the upper surface of the body 230 may have an area corresponding to a bottom surface of the dielectric plate 220, and may be bonded to the bottom surface of the dielectric plate 220. The body 230 may have first circulation passages 231, second circulation passages 232, and second supply passages 233 in the interior thereof The first circulation passages 231 may be provided as passages through which a heat transfer medium circulates. The first circulation passages 231 may be formed in the interior of the body 230 to have spiral shapes. Further, the first circulation passages 231 may be disposed such that passages having ring shapes of different radii have the same center. The first circulation passages 231 may communicate with each other. The first circulation passages 231 may be formed at the same height.

The second circulation passages 232 may be provided as passages through which a cooling fluid circulates. The second circulation passages 232 may be formed in the interior of the body 230 to have a spiral shape. Further, the second circulation passages 232 may be disposed such that passages having ring shapes of different radii have the same center. The second circulation passages 232 may communicate with each other. The second circulation passages 232 may have a sectional area that is larger than that of the first circulation passage 231. The second circulation passages 232 may be formed at the same height. The second circulation passages 232 may be located under the first circulation passages 231.

The second supply passages 233 may extend upwards from the first circulation passages 231, and may be provided on an upper surface of the body 230. The number of the second supply passages 243 corresponds to the first supply passages 221 and may connect the first circulation passages 231 and the first supply passages 221.

The first circulation passages 231 may be connected to a heat transfer medium storage 231a through heat transfer medium supply lines 231b. A heat transfer medium may be stored in the heat transfer medium storage 231a. The heat transfer medium may include an inert gas. According to an embodiment, the heat transfer medium may include a helium (He) gas. The helium gas may be supplied to the first circulation passages 231 through the supply lines 231b, and may be supplied to the bottom surface of the substrate S after sequentially passing through the second supply passages 233 and the first supply passages 221. The helium gas may function as a medium by which the heat transferred from plasma to the substrate S is transferred to the electrostatic chuck 210.

The second circulation passages 232 may be connected to the cooling fluid storage 232a through the cooling fluid supply lines 232c. The cooling fluid storage 232a may store a cooling fluid. A cooler 232b may be provided in the cooling fluid storage 232a. The cooler 232b may cool the cooling fluid to a specific temperature. Unlike this, the cooler 232b may be installed on the cooling fluid supply line 232c. The cooling fluid supplied to the second circulation passages 232 through the cooling fluid supply lines 232c may cool the body 230 while circulating along the second circulation passages 232. The body 230 may cool the dielectric plate 220 and the substrate S together while being cooled to maintain the substrate S at a specific temperature.

The body 230 may include a metal plate. The body 230 may function as a lower electrode. In this case, the body 230 is connected to a lower power supply unit 233. The lower power supply unit 233 applies an electric voltage to the body 230, that is, the lower electrode. The lower power supply unit 233 includes three lower power sources 236a, 237a, and 238a, a matching unit 235, and a pulse supply 280. As an embodiment, two of the three lower power sources may be a first frequency power source 236a and a second frequency power source 237a having a frequency of 10 MHz or less, and the remaining one of the three lower power sources may be a third frequency power source 238a having a frequency of 10 MHz or more. Switches 236b, 237b, and 238b may be connected to the three lower power sources 236a, 237a, and 238a, respectively, to be electrically connected to the lower electrode according to an on/off state of the switch 223b. The first frequency power source 236a and the second frequency power source 237a may adjust ion energy, and the third frequency power source 238a may adjust a density of plasma.

The pulse supply 280 may apply an on/off pulse to the lower power sources 236a, 237a, and 238a. Pulsed high frequency power may be applied from the lower power sources 236a, 237a, and 238a to the body 230, that is, the lower electrode according to an on/off pulse applied by the pulse supply 280.

The matching unit 235 is electrically connected to the first to third frequency power sources 236a, 237a, and 238a, and matches frequency power of different intensities to apply the frequency power to the body 230 functioning as the lower electrode.

The focus ring 240 may be disposed at a peripheral area of the electrostatic chuck 210. The focus ring 240 may have a ring shape and may be disposed along a circumference of the dielectric plate 220. An upper surface of the focus ring 240 may be stepped such that an outer side 240a thereof is higher than an inner side 240b thereof. The inner side 240b of the upper surface of the focus ring 240 may be located at the same height as that of the upper surface of the dielectric plate 220. The inner side 240b of the upper surface of the focus ring 240 may support a peripheral area of the substrate S located on an outside of the dielectric plate 220. The outside 240a of the focus ring 240 may be provided to surround a peripheral area of the substrate S. The focus ring 240 may control an electromagnetic field such that densities of plasma are uniformly distributed in the whole area of the substrate S. Accordingly, plasma is uniformly formed over the whole area of the substrate S such that the areas of the substrate S may be uniformly etched.

The lower cover 250 may be located at a lower end of the substrate support assembly 200. The lower cover 250 may be spaced upwards apart from the bottom surface of the chamber 100. An open-topped space 255 may be formed in the interior of the lower cover 250. The outer radius of the lower cover 250 may have the same as the outer radius of the body 230. A lift pin module (not illustrated) that moves the transferred substrate S from a transfer member on the outside to the electrostatic chuck 210 may be located in the interior space 255 of the lower cover 250. The lift pin module (not illustrated) may be spaced apart from the lower cover 250 by a specific interval. A bottom surface of the lower cover 250 may be formed of a metallic material. The interior space 255 of the lower cover 250 may be provided with air. Because the dielectric constant of air is lower than that of an insulator, the air may reduce an electromagnetic field in the interior of the substrate support assembly 200.

The lower cover 250 may have a connecting member 253. The connecting member 253 may connect an outer surface of the lower cover 250 and an inner wall of the chamber 100. A plurality of connecting members 253, for example more than two connecting members 253, may be provided on an outer surface of the lower cover 250 at a specific interval. The connecting member 253 may support and secure the substrate support assembly 200 in the interior of the chamber 100. Further, the connecting member 253, which are separate members from the lower cover 250, may be connected to the inner wall of the chamber 100 such that the lower cover 250 is electrically grounded. A first power line 223c connected to the first power source 223a, a second power line 225c connected to the second power source 225a, power lines 236c, 237c, and 238c connected to the three lower power sources 236a, 237a, and 238a, a heat transfer medium supply line 23 1b connected to the heat transfer medium storage 231a, and a cooling fluid supply line 232c connected to the cooling fluid storage 232a may extend into the lower cover 250 through the interior space 255 of the connecting member 253.

A plate 270 may be located between the electrostatic chuck 210 and the lower cover 250. The plate 270 may cover and seal an upper surface of the lower cover 250. The plate 270 may have a sectional area corresponding to the body 230 and the lower cover 250. The plate 270 may include an insulator. According to an embodiment, one or more plates 270 may be provided. The plate 270 may function to increase an electrical distance between the body 230 and the lower cover 250.

The plasma generating unit 300 may excite a process gas in the chamber 100 into a plasma state. The plasma generating unit 300 may use a plasma source of a capacitively coupled plasma (CCP) type. When the plasma source of a CCP type is used, an upper electrode 330 and a lower electrode, that is, the body 230 may be included in the chamber 100. The upper electrode 330 and the lower electrode 230 may be vertically disposed in parallel to each other while a treatment space is interposed therebetween. The upper electrode 330 as well as the lower electrode 230 may receive RF signals from an RF power source 310 to receive energy for generating plasma, and the number of RF signals applied to the electrodes is not limited to one as illustrated. An electromagnetic field may be formed in a space between the two electrodes, and the process gas supplied into the space may be excited into a plasma state. A substrate treating process is performed by using the plasma.

The gas supply unit 400 may supply a process gas into the interior of the chamber 100. The gas supply unit 400 may include a gas supply nozzle 410, a gas supply line 420, and a gas storage unit 430. The gas supply nozzle 410 may be installed at a central portion of the upper surface of the chamber 100. An ejection hole may be formed on the bottom surface of the gas supply nozzle 410. A process gas may be supplied into the interior of the chamber 100 through the ejection hole. The gas supply unit 400 may connect the gas supply nozzle 410 and the gas storage unit 430. The gas supply line 420 may supply the process gas stored in the gas storage unit 430 to the gas supply nozzle 410. A valve 421 may be installed in the gas supply line 420. The valve 421 may open and close the gas supply line 420, and may adjust a flow rate of the process gas supplied through the gas supply line 420.

The baffle unit 500 may be located between the inner wall of the chamber 100 and the substrate support assembly 200. The baffle 510 may have an annular ring shape. The baffle 510 may have a plurality of through-holes 511. The process gas provided into the chamber 100 may pass through through-holes 511 of the baffle 510 to be exhausted through an exhaust hole 102. The flow of the process gas may be controlled according to the shape of the baffle 510 and the shape of the through-holes 511.

Figure 2:
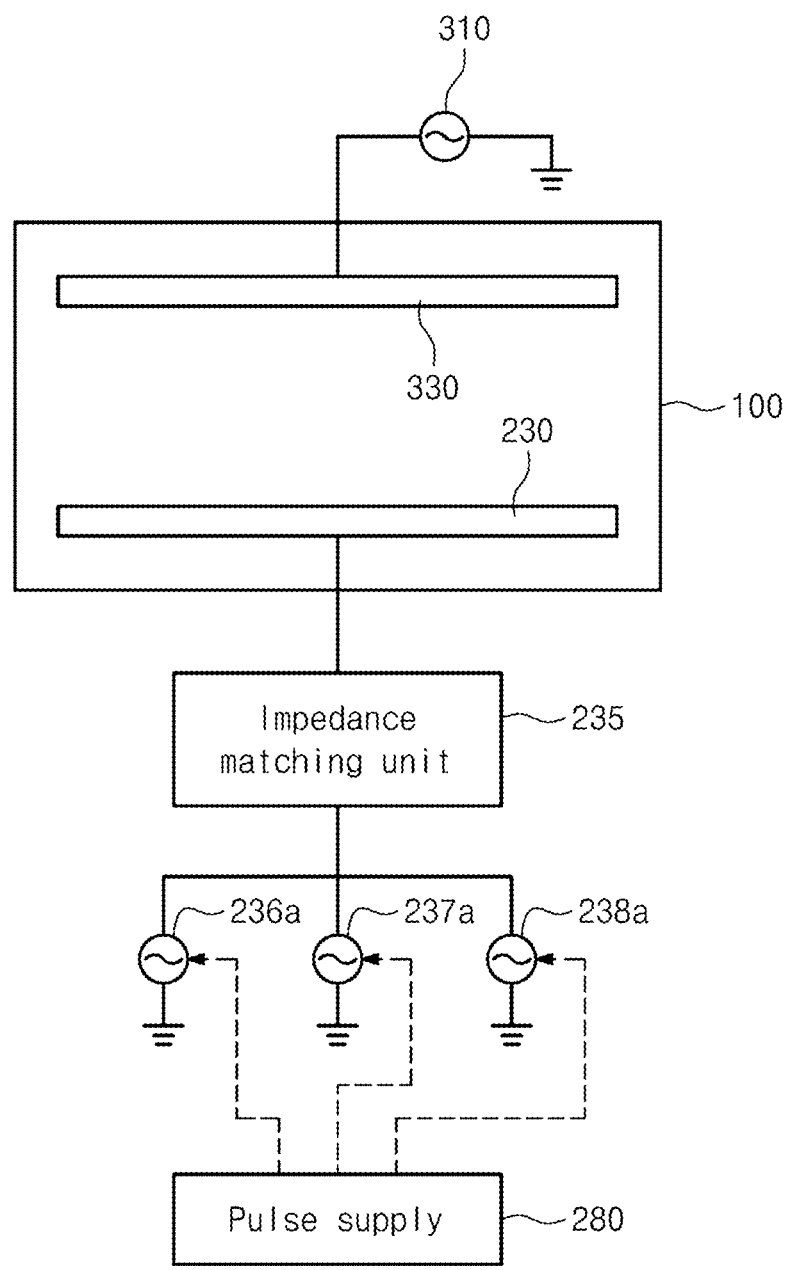
FIG. 2 is an exemplary schematic view illustrating a plasma generating apparatus according to an embodiment of the inventive concept.

FIG. 2 is an exemplary schematic view illustrating a plasma generating apparatus according to an embodiment of the inventive concept.

As illustrated in FIG. 2, the plasma generating apparatus according to the embodiment includes an upper electrode 330 and a lower electrode 230 disposed to face each other while a space for generating plasma in a process chamber 100 is interposed therebetween, and may include an upper power source 310 that applies electric power to the upper electrode, and three lower power sources 236a, 237a, and 238a that applies high frequency power having different frequencies to the lower electrode 230. Further, the plasma generating apparatus may further include a pulse supply 280 that applies an on/off pulse to the lower power sources 236a, 237a, and 238a.

The three lower power sources 236a, 237a, and 238a are high frequency power sources that apply high frequency power to the lower electrode 230, and two of the high frequency power sources may have frequencies of 10 MHz or less and the remaining one of the high frequency power sources may have a frequency of 10 MHz or less. That is, the three high frequency power sources may include a first frequency power source 236a and a second frequency power source 237a having frequencies ranging from 50 KHz to 10 MHz, and a third frequency power source 238c having a frequency ranging from 10 MHz to 100 MHz. In this case, the first frequency power source 236a and the second frequency power source 237a control ion energy that is input to a substrate. That is, the frequencies of 10 MHz or less is applied to a plasma sheath having a high impedance in a vacuum chamber and in which only ions exist, and accordingly, ion energy increases so that an etching rate by ions input to the substrate increases. The third frequency power source 238c may improve a density of plasma. That is, as a high frequency of 10 MHz or more is applied, an area for the plasma sheath is reduced, and accordingly, ion energy becomes lower. Accordingly, electric power lost to ions is reduced so that the electric power applied from the third frequency power source 238c having a frequency of 10 MHz or more improves a density of the plasma. As an embodiment, the frequency of the first frequency power source 236a may be 400 MHz or 2 MHz, the frequency of the second frequency power source 237a may be 9.8 MHz, and the frequency of the third frequency power source 238c may be 60 MHz.

As an embodiment, the upper power source 310 that applies electric power to the upper electrode 330 may be a high frequency power source that provides high frequency power having a fourth frequency. As an example, the fourth frequency may range from 10 MHz to 100 MHz. In this case, the upper power source 310 may control the density of the plasma. As another embodiment, the upper electrode 330 may be electrically connected to a DC power source or connected to a reference potential unlike the one illustrated in FIG. 2. In this case, a uniform etching rate may be obtained over the whole area of the substrate by maintaining a stable potential in the chamber.

The pulse supply 280 may be connected to the lower power sources to independently apply an on/off pulse to the lower power sources. As high frequency power pulsed by the pulse supply is applied, a temperature of electrons may decrease in an off area, electric chargers accumulated in the substrate may be reduced, and a ratio of radicals generated in the interior of the plasma may be controlled. As an embodiment, the pulse supply 280 may apply an on/off pulse only with some of the three lower power sources but some lower power sources may provide pulsed high frequency power and the remaining lower power source may apply a sine wave.

Figure 3:
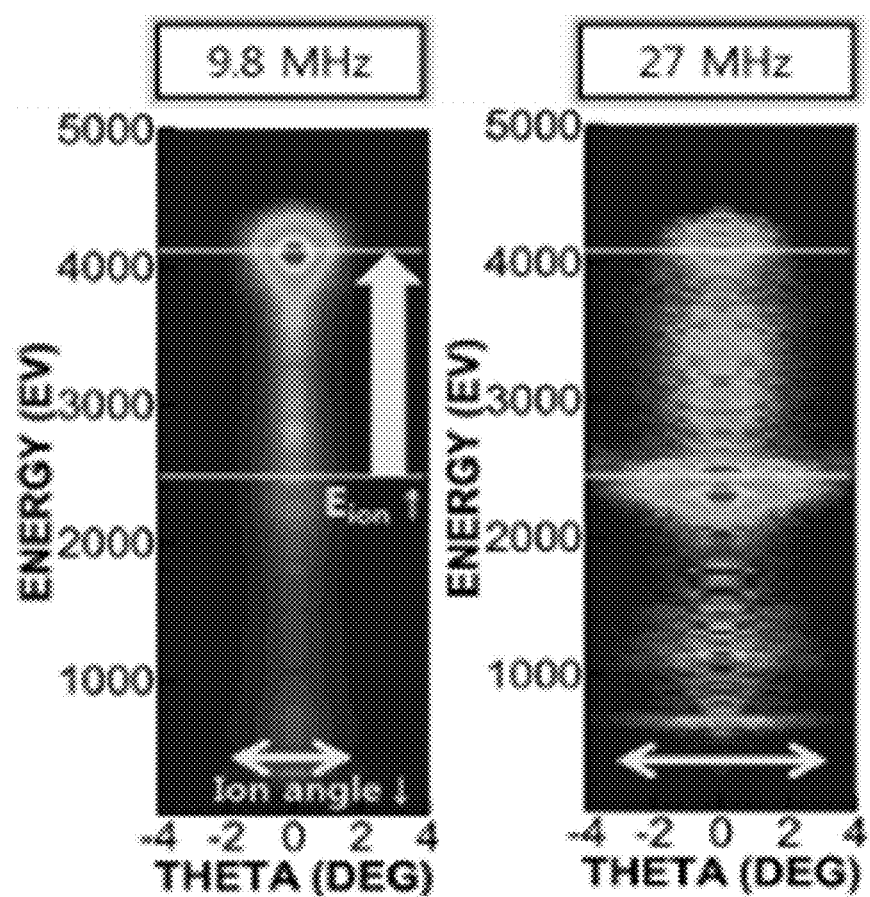
FIG. 3 is a view illustrating a simulation result of distribution of ion energy according to an angle of ions input to a substrate in the case of a frequency according to an embodiment of the inventive concept.

FIG. 3 is a view illustrating a simulation result of distribution of ion energy according to an angle of ions input to a substrate in the case of a frequency according to an embodiment of the inventive concept.

Referring to FIG. 3, when electric power having a frequency of 9.8 MHz that is a frequency of the second frequency power source according to the embodiment of the inventive concept is applied, it may be identified that the angles of ions input to the substrate have a smaller distribution while the ions have ion energy that is much higher as compared with the case in which the electric power having a frequency of 27 MHz is applied. Accordingly, according to the embodiment of the inventive concept, ions may be controlled more precisely when a high frequency power source having a frequency of 9.8 MHz, among the three frequency power sources, is used.

Figure 4:
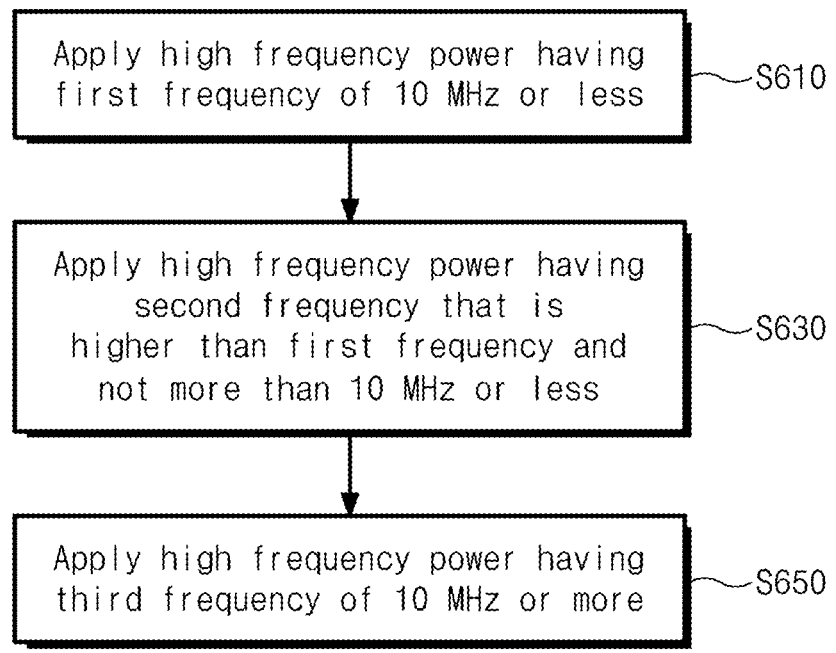
FIG. 4 is a flowchart illustrating a substrate treating method according to an embodiment of the inventive concept.

FIG. 4 is a flowchart illustrating a substrate treating method according to an embodiment of the inventive concept.

As illustrated in FIG. 4, the substrate treating method according to the embodiment of the inventive concept may include an operation S610 of applying high frequency power having a first frequency of 10 MHz or less, an operation S630 of applying high frequency power having a second frequency that is higher than the first frequency and not more than 10 MHz, and an operation S650 of applying high frequency power having a third frequency of 10 MHz or more. As an embodiment, the first frequency may be 400 KHz to 2 MHz, the second frequency may be 9.8 MHz, and the third frequency may be 60 MHz. The substrate treating method according to the embodiment of the inventive concept may further include an operation of connecting a DC power source or a reference potential to the upper electrode. As another embodiment, the substrate treating method may further include an operation of applying high frequency power having a fourth frequency ranging from 10 MHz to 100 MHz to the upper electrode.

According to an embodiment of the inventive concept, the substrate may be uniformly etched by controlling a density of plasma and ion energy more precisely.

The effects of the prevent invention are not limited the above-mentioned ones. Unmentioned effects will be clearly understood from the specification and the accompanying drawings by those skilled in the art to which the inventive concept pertains.

It is noted that the above embodiments are suggested for understanding of the inventive concept and do not limit the scope of the inventive concept, and various modifiable embodiments also fall within the scope of the inventive concept. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:
1. A substrate treating apparatus comprising:
a process chamber having a treatment space in the interior thereof;
a support unit disposed in the process chamber to support a substrate;
a gas supply unit configured to supply a process gas into the process chamber;
a lower cover located at a lower end of the support unit, wherein an interior space of the lower cover between the support unit and the lower cover is provided with air, wherein the lower cover comprises more than two connecting members connecting an outer surface of the lower cover and an inner wall of the process chamber to support and secure the support unit in the interior of the process chamber, wherein the more than two connecting members are separate members from the lower cover, and wherein a bottom surface of the lower cover is formed of a metallic material;
a plate located between the support unit and the lower cover, and configured to cover and seal an upper surface of the lower cover, wherein the plate includes an insulator, wherein sectional areas of the support unit, the plate and the lower cover are the same; and
a plasma generating unit configured to generate plasma from the process gas,
wherein the plasma generating unit includes:
an upper electrode disposed above the substrate;
a lower electrode disposed under the substrate to be vertically opposite to the upper electrode; and
three high frequency power sources configured to apply high frequency power to the lower electrode,
wherein the three high frequency power sources include:
a first frequency power source and a second frequency power source having frequencies of 10 MHz or less; and
a third frequency power source having a frequency of 60 MHz.

2. The substrate treating apparatus of claim 1, wherein the first frequency power source and the second frequency power source have frequencies ranging from 50 KHz to 10 MHz.

3. The substrate treating apparatus of claim 2, wherein the frequency of the first frequency power source is 400 KHz or 2 MHz, and the frequency of the second frequency power source is 9.8 MHz.

4. The substrate treating apparatus of claim 1, wherein the high frequency power applied by the first frequency power source and the second frequency power source increases ion energy input to the substrate, and wherein the high frequency power applied by the third frequency power source increases a density of plasma.

5. The substrate treating apparatus of claim 1, wherein the upper electrode is connected to a DC power source or a reference potential.

6. The substrate treating apparatus of claim 1, wherein the upper electrode is connected to a fourth frequency power source having a frequency ranging from 10 MHz to 100 MHz.

7. The substrate treating apparatus of claim 2, further comprising:

a pulse supply configured to apply an on/off pulse to the three high frequency power sources.

8. The substrate treating apparatus of claim 7, wherein the plasma generating unit independently controls pulse frequencies of the three high frequency power sources.

9. The substrate treating apparatus of claim 1, wherein the plasma generating unite further includes a matching unit electrically connected to the first, second and third frequency power sources and is configured to match frequency power of different intensities to apply the frequency power to the lower electrode.

* * * * *